United States Patent
Hair et al.

(10) Patent No.: US 6,292,707 B1
(45) Date of Patent: Sep. 18, 2001

(54) INTEGRATED DESIGN AND MANUFACTURING SYSTEM

(75) Inventors: Joan B. Hair, Hermosa Beach; Brian E. Parrish, Garden Grove; Andrea L. Reilly, Torrance; Timothy M. Webb, Redondo Beach, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/190,736

(22) Filed: Nov. 12, 1998

(51) Int. Cl.[7] ...................................................... G06F 19/00
(52) U.S. Cl. ............................. 700/97; 700/95; 700/104; 706/919
(58) Field of Search ................................. 706/919, 923; 700/95, 96, 97, 103, 104, 106

(56) References Cited

U.S. PATENT DOCUMENTS

| | | | |
|---|---|---|---|
| 5,552,995 | * | 9/1996 | Sebastian ................................ 700/97 |
| 5,748,943 | * | 5/1998 | Kaepp et al. ............................. 703/1 |
| 5,842,192 | * | 11/1998 | Garcia et al. ........................... 706/45 |
| 5,991,528 | * | 11/1999 | Taylor et al. ............................. 703/6 |
| 6,116,766 | * | 9/2000 | Maseeh et al. .......................... 700/97 |
| 6,177,942 | * | 1/2001 | Keong et al. ........................... 345/356 |

\* cited by examiner

*Primary Examiner*—William Grant
*Assistant Examiner*—Paul Rodriguez

(57) ABSTRACT

The present invention provides an integrated design and manufacturing system (100). The system (100) includes a specification step (102), a sequence of events step (104), a model step (106), a graphics step (108), a method sheets step (110), a configuration control step (112), and a parts list step (114). Through the use of libraries of standards, or defaults, as well as the use of an integrated product team, the system (100) establishes the product and process definition for a new part. A product-specific series of documentation is developed and includes the following: Specification, Model, Parts List, Graphics, Sequence of Events (SOE), Work Instructions (Method Sheets), and Configuration Control. Upon completion of all of these, the design of both the product and the process is compatible and complete and is released into production. Since production will be working directly from the Method Sheets, an end-item-requirements document is not necessary. Once in production, the workers provide feedback to the integrated product team for clarification and changes.

6 Claims, 4 Drawing Sheets

INTEGRATED DESIGN AND MANUFACTURING SYSTEM

BACKGROUND OF THE INVENTION

The present invention relates to a system for product creation. In particular, the present invention relates to an integrated design and manufacturing system. Using past design processes, engineering and manufacturing communicate formally using end-item-requirements drawings that define the product requirements for a particular deliverable item. In the past, engineering first considered the product requirements and developed a design that satisfied only those product requirements. The final design was documented by the end-item-requirements drawing and marked the completion of the design phase. Manufacturing next began production by translating the drawing into sequential process steps, visual aides and a work order that resulted in a deliverable item that met the product requirements shown on the end-item-requirements drawing.

Neither organization, however, was fully cognizant of both product and process requirements or their mutual interaction, which resulted in wasted time, effort and money. Thus, past design processes did not ensure the lowest product cost, time to market, or efficiency of labor. Furthermore, the past design processes were open to translation errors during the manufacturing processes. In addition, the construction techniques, although technically within specification, often produced adverse effects on the deliverable item that were not foreseen by engineering at the time of initial design. Additional time, money, and effort was therefore required to generate appropriate change orders. As a result, the past design process increased cycle time, decreased yield, and increased design and manufacturing cost.

A need has long existed in industry for an improved product creation process that overcomes the deficiencies noted above.

It is an object of the present invention to provide a process by which a product may be produced with minimum cost while reducing the time to market.

It is another object of the present invention to provide a process by which a product may be produced with highest quality while reducing the time to market.

It is a further object of the present invention to provide a process by which a product may be produced with highest consistency while reducing the time to market.

One or more of the foregoing objects are met in whole or in part by the present integrated design and manufacturing system. The system first develops a library of default process steps and product design data. When a new part design is initiated, the library of default process steps is periodically checked against part requirements to ensure that the new part design is produced within the part requirements. If the library of default process steps does not produce the new part design within the part requirements, a new process step is identified and replaces the default process step. Alternatively, the new part design may be modified if a certain part parameter does not allow the part to be produced within part requirements. The system further allows the creation of operator work instructions and provides for on-line real-time feedback by operators on the work instructions.

DETAILED DESCRIPTION OF THE INVENTION

Figure 1:
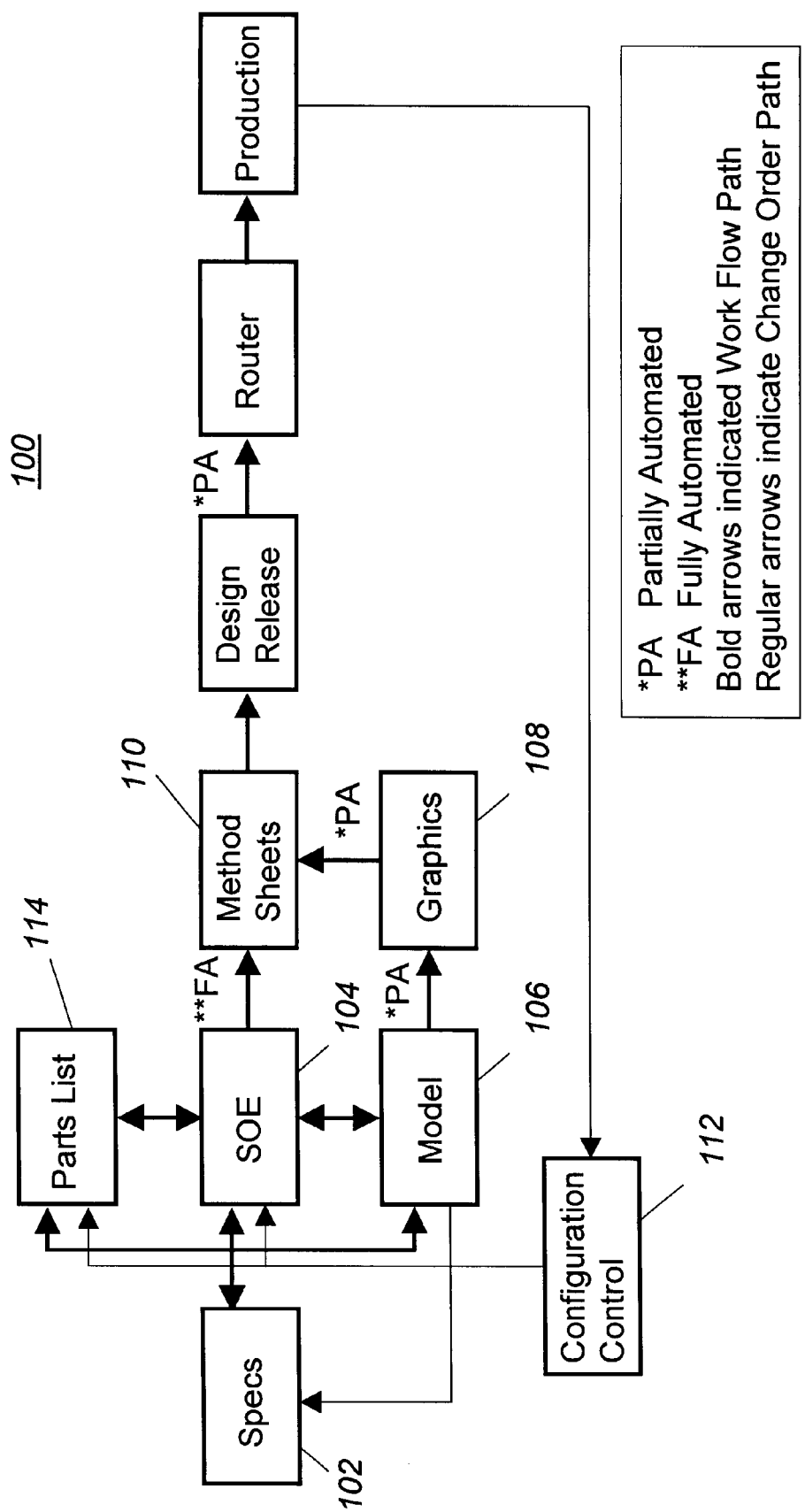
FIG. 1 illustrates a preferred embodiment of the present integrated design and manufacturing system.

Turning now to the drawings, FIG. 1 is a block diagram of the present integrated design and manufacturing system 100. The system 100 includes a specification step 102, a complete sequence of events step 104, a model step 106, a graphics step 108, a method sheets step 110, a configuration control step 112, and a parts list step 114.

In the specification step 102, the product requirements are defined by breaking down a customer's overall product requirements into sub-elements of a design. In addition, performance parameters, such as power output, noise level, and weight, are defined. Schematics, interconnect diagrams, and test requirements may also be included.

The system uses an integrated product team (IPT) comprised of members representing the critical decision-making functions. For example, the IPT may include Systems Engineering, Electrical Engineering, Customer, Mechanical Engineering, Materials and Processes, Manufacturing, Planning and Quality. The IPT generates the product design for a product in parallel with the process steps for constructing this product. To accomplish this, the IPT draws from a library of standards or defaults that includes product design data and default process steps. In particular, the libraries may include the following:

i. Specifications. The Specification library may contain data on circuit standards, noise levels, throughput, weight, power dissipation, and environment.

ii. Model. The Model library may contain known product geometric configurations which meet particular commonly occurring specifications iii. Sequence of Events (SOE). The SOE library may contain process standards associated with commonly occurring model configurations.

iv. Parts List. The Parts List library may contain preferred components associated with commonly occurring model configurations and commonly occurring SOE configurations.

v. Graphics. The Graphics library may contain pictorials of commonly occurring process steps from the SOE. It may also contain default view preferences for commonly recurring steps of an SOE.

When faced with a specification that cannot be accomplished by use of the known default standards, either an effort is launched to change the process step or product design or to change the specification. Once resolved, the IPT completes the product design, and the process design is then documented in the appropriate database. A means of coordinating databases may be used. The databases are used to generate the sequential work instructions for the production operator, and the system provides for feedback by the operators on the work instructions. When complete, the SOE (compiled in the SOE step 104) is therefore a step-by-step process for building or assembling a particular part that provides process specific information and process specific end item requirements.

In parallel with the creation of a new SOE for a particular part, the system 100 also creates a model of the given part in the model step 106. The product design team may use electronic modeling software or any modeling technique that aides the determination of the geometric end requirements (or part parameters) for the part. In addition to the model created in model step 106, views are created from the model for the generation of graphics in the graphics step 108. If electronic modeling software is used, these views can be automatically produced. The filenames of the view files may be written into the SOE. The views may contain color-coding, photographs, and artist renderings to make a particular pictorial even more clear to the operators, i.e., those producing or assembling the part.

Using the SOE from the SOE step 104 and the views from the graphics step 108, method sheets are created in the methods sheets step 110. The operator at a workstation, for example, typically accesses a method sheet by bar code. When accessed, a database, for example, locates the appropriate SOB for that operation, as well as any accompanying views, and displays both in the form of a method sheet via a computer screen. The system may also use method sheets in paper form. Thus, the system 100 eliminates the interpretation and re-inputting of graphical data by requiring the design team to establish the process and product requirements simultaneously. Often using colors, the method sheets visually display the part being built at each operation and provide "friendly" work instructions. In electronic form, the viewing software may further provide pan and zoom capabilities to eliminate separate blow up views.

Because the method sheets may be displayed electronically, operators may provide on-line real-time feedback to the part of the system 100. Thus, feedback may be utilized in the configuration control step 112, where the system 100 evaluates the feedback provided and determines whether a change to the SOE or part design is necessary.

As the SOE and model are being developed, a parts list may further be created simultaneously in the parts list step 114. The parts list contains end item component requirements for a particular assembly, and identifies the manufacturer, part number, description, and cost for each part used in the assembly.

Once the method sheets are complete, the design is considered complete and is released for production. This signifies the completion of both the product and process design. From this release, a router is developed from major headings on the sequence of events. This router travels with the part into production, where the part is actually manufactured. An end-item-requirement document is not required.

Figure 2:
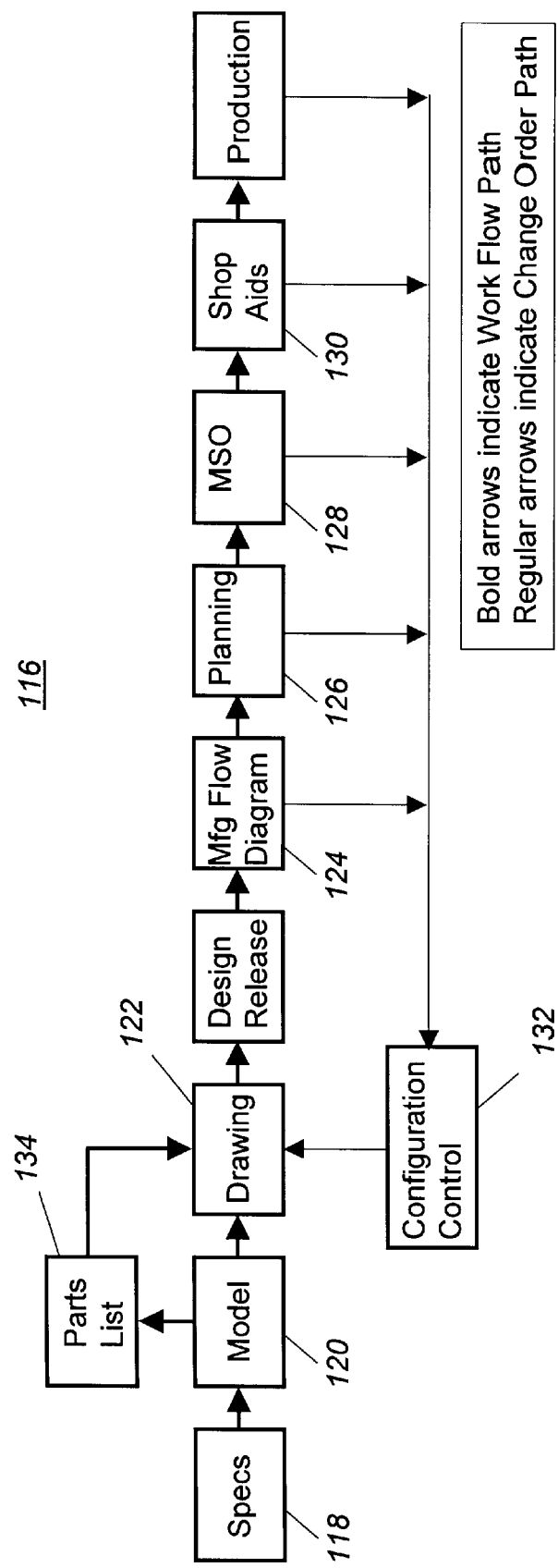
FIG. 2 shows an example of the past design process.

As shown in FIG. 2, in the past design process 116, the steps of designing the part and developing the manufacturing processes were separate. The past design process 116 includes the specs step 118, the model step 120, the drawing step 122, the mfg ("manufacturing") flow diagram step 124, the planning step 126, the MSO ("manufacturing shop order") step 128, the shop aids step 130, the configuration control step 132, and the parts list step 134. Note that the past design process used several steps similar to those used in the present invention, but that the steps occurred in sequential order as opposed to concurrently. The sequential nature of the past design process increased cycle time, decreased yield, as well as increased design and manufacturing cost.

In the present system, separate sequential steps are collapsed into concurrent steps. The present system thereby importantly focuses the IPT on defining both the product and the process simultaneously. For example, in the past design process 116, the model step 120 occurred, followed by the drawing step 122. This was then considered a complete design by engineering. Subsequently, manufacturing determined how to build the part by creating the mfg ("manufacturing") flow diagram step 124. From there the design flowed to planning and MSO. In these steps, the model of the part was created, followed by the creation of the work instructions.

Figure 3:
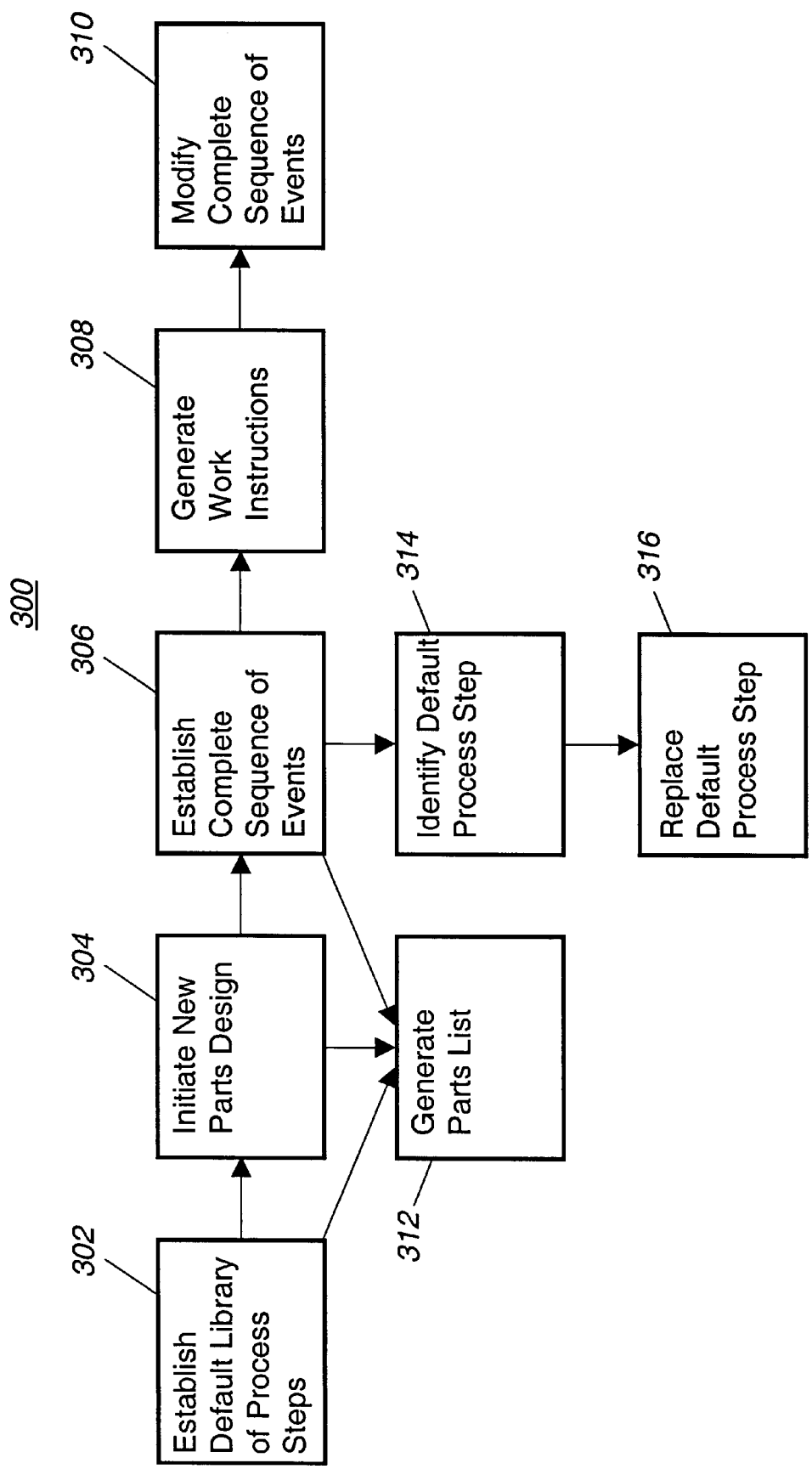
FIG. 3 is a high-level flowchart illustrating the steps undertaken in an integrated design and manufacturing system when modifying a process step.
Figure 4:
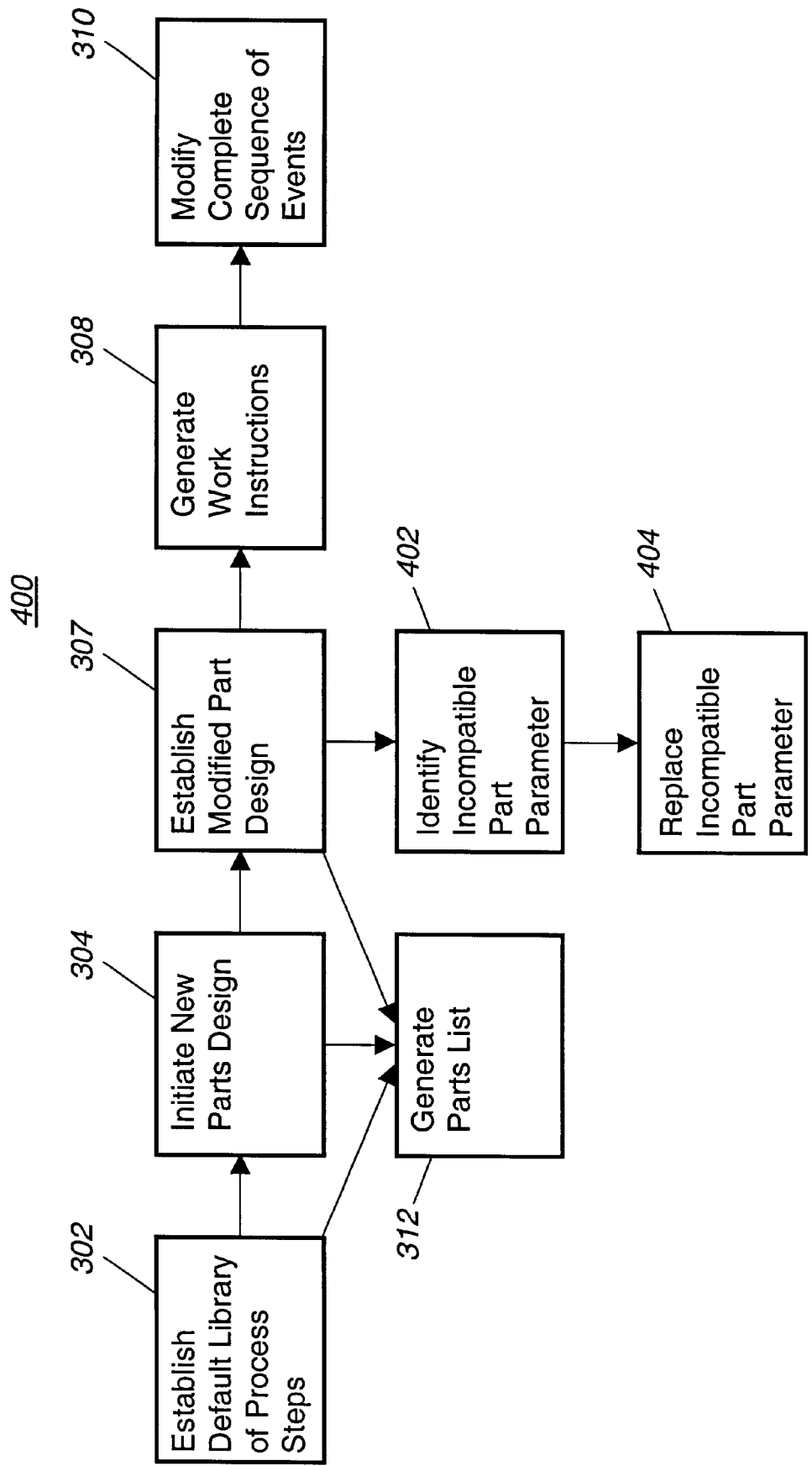
FIG. 4 is a second high-level flowchart illustrating the steps undertaken in an integrated design and manufacturing system when modifying a part parameter.

FIG. 3 is a high-level flowchart diagram 300 illustrating an integrated design and manufacturing system where the default process steps are modified. FIG. 4 is a high-level flowchart diagram 400 illustrating an integrated design and manufacturing system where the part design is modified.

In FIGS. 3 and 4, the flowchart diagrams include an establishing library step 302, an initiation step 304, and an establish SEW step 306. Also included are a generate instruction step 308, a modify step 310, a generate parts list step 312, and an a identify step 314 (FIG. 4 illustrates an alternate identify step 402).

At step 302, a default library of process steps and product design data is established. A new parts design is initiated at step 304 and modified at step 307. Concurrently, a parts list is generated and updated at step 312. When the part design is finished, work instructions are generated at step 308 and a complete SOE is produced at step 310, with any required modifications.

As the part is being designed, the default process steps may be checked for compatibility with creation of the part at step 314. Those that are incompatible with creation of the part are identified, then subsequently replaced at step 316 with a modified process step that is compatible with creation of the part.

Similarly, in FIG. 4, as the part is being designed, the parameters of the part itself (e.g., its size, contours and the like) are checked for compatibility with the methods used to create the part. Incompatible parameters are identified at step 402 and replaced with a compatible parameter at step 404.

While particular elements, embodiments and applications of the present invention have been shown and described, it is understood that the invention is not limited thereto since modifications may be made by those skilled in the art, particularly in light of the foregoing teaching. It is therefore contemplated by the appended claims to cover such modifications and incorporate those features that come within the spirit and scope of the invention.

What is claimed is:

1. An integrated design and manufacturing method for a part comprising:

a. establishing a library of default process steps and product design data, including a parts list library of preferred components associated with model configurations and sequence of events configurations for the part;

b. initiating a new part design for the part based on said library and periodically checking said new part design against a predetermined set of new part requirements;

c. establishing a complete sequence of events for said new part design for the part, said establishing step comprising:

i. identifying a default process step in said library of default process steps incompatible with production of said new part design within said part requirements; and ii. replacing said default process step with a revised step compatible with production of said new part design within said part requirements; and d. generating work instructions based on said sequence of events and said new part design for building or assembling said part.

2. An integrated design and manufacturing method as claimed in claim 1 further comprising the step of:

modifying said complete sequence of events based on feedback from said work instructions.

3. An integrated design and manufacturing method as claimed in claim 2 further comprising the step of:

generating concurrently a parts list for said new part design.

4. An integrated design and manufacturing method for a part comprising the steps of:

a. establishing a library of default process steps and default sequence of events, including a parts list library of preferred components associated with model configurations and sequence of events configurations for the part;

b. initiating a new part design for the part based on said library and periodically checking said new part design against a predetermined set of part requirements;

c. establishing a modified part design, said establishing step comprising:

i. identifying a part parameter incompatible with production of said new part within said part requirements using said library; and ii. replacing said part parameter with a revised part parameter compatible with production of said new part design within said part requirements; and d. generating work instructions based on said modified part design for building or assembling said part.

5. An integrated design and manufacturing method as claimed in claim 4 further comprising the step of:

modifying said sequence of events based on feedback from said work instructions.

6. An integrated design and manufacturing method as claimed in claim 5 further comprising the step of:

generating concurrently a parts list for said new part design.

* * * * *